US010950574B2

(12) United States Patent
Goll et al.

(10) Patent No.: US 10,950,574 B2
(45) Date of Patent: Mar. 16, 2021

(54) SENSOR HAVING SYSTEM-IN-PACKAGE MODULE, METHOD FOR PRODUCING THE SAME, AND SENSOR ARRANGEMENT

(71) Applicant: Continental Teves AG & Co. oHG, Frankfurt (DE)

(72) Inventors: Manfred Goll, Glauburg (DE); Martin Haverkamp, Frankfurt am Main (DE); Michael Schulmeister, Groß-Zimmern (DE)

(73) Assignee: Continental Teves AG & Co. oHG

( * ) Notice: Subject to any disclaimer, the term of this patent is extended or adjusted under 35 U.S.C. 154(b) by 0 days.

(21) Appl. No.: 16/092,516

(22) PCT Filed: Jun. 2, 2017

(86) PCT No.: PCT/EP2017/063543
§ 371 (c)(1),
(2) Date: Oct. 10, 2018

(87) PCT Pub. No.: WO2017/207795
PCT Pub. Date: Dec. 7, 2017

(65) Prior Publication Data
US 2019/0139931 A1  May 9, 2019

(30) Foreign Application Priority Data

Jun. 3, 2016 (DE) .................... 10 2016 209 840.3

(51) Int. Cl.
*H01L 23/00* (2006.01)
*H01L 23/31* (2006.01)
(Continued)

(52) U.S. Cl.
CPC ............ *H01L 24/96* (2013.01); *G01D 11/245* (2013.01); *H01L 23/3121* (2013.01);
(Continued)

(58) Field of Classification Search
CPC combination set(s) only.
See application file for complete search history.

(56) References Cited

U.S. PATENT DOCUMENTS 5,640,760 A    6/1997  Val et al.
5,940,681 A *  8/1999  Seeger ................. G01N 21/956
                                                              438/14
(Continued)

FOREIGN PATENT DOCUMENTS

CN      102856396 A      1/2013
CN      103367304 A      10/2013
(Continued)

OTHER PUBLICATIONS

German Search Report for German Application No. 10 2016 209 840.3, dated Mar. 17, 2017, with partial translation—10 pages.
(Continued)

*Primary Examiner* — Nduka E Ojeh
(74) *Attorney, Agent, or Firm* — RatnerPrestia

(57) ABSTRACT

A sensor including a system-in-package module, wherein electrical contacts can be contact-connected by way of a mating connector. An associated method and an associated sensor arrangement are also disclosed.

18 Claims, 9 Drawing Sheets

(51) Int. Cl.
*G01D 11/24* (2006.01)
*H05K 3/40* (2006.01)
*H05K 5/00* (2006.01)
*H01R 12/72* (2011.01)
*H01L 21/56* (2006.01)
*H05K 1/11* (2006.01)

(52) U.S. Cl.
CPC ........... *H01L 24/24* (2013.01); *H05K 3/4007* (2013.01); *H05K 5/0078* (2013.01); *H01L 21/568* (2013.01); *H01L 2224/04105* (2013.01); *H01L 2224/24137* (2013.01); *H01L 2224/24175* (2013.01); *H01L 2224/24195* (2013.01); *H01L 2224/97* (2013.01); *H01L 2924/1532* (2013.01); *H01L 2924/15192* (2013.01); *H01L 2924/19105* (2013.01); *H01R 12/721* (2013.01); *H05K 1/117* (2013.01); *H05K 3/4015* (2013.01); *H05K 2201/10318* (2013.01)

(56) References Cited

U.S. PATENT DOCUMENTS

| | | |
|---|---|---|
| 6,809,367 B2 | 10/2004 | Val |
| 8,904,864 B2 | 12/2014 | Ludwig |
| 8,916,079 B2 | 12/2014 | Ludwig |
| 8,946,664 B2 | 2/2015 | Tsukagoshi et al. |
| 9,231,118 B2 | 1/2016 | Ausserlechner |
| 9,453,745 B2 | 9/2016 | Hortig et al. |
| 9,614,299 B2 | 4/2017 | Ludwig et al. |
| 2006/0134937 A1 | 6/2006 | Mayuzumi et al. |
| 2009/0243082 A1 | 10/2009 | Camacho et al. |
| 2013/0292852 A1 | 11/2013 | Fuergut et al. |
| 2014/0184263 A1 | 7/2014 | Ehrenpfordt et al. |
| 2015/0206813 A1* | 7/2015 | Gandhi ............... H01L 21/6835 438/109 |
| 2017/0288346 A1 | 10/2017 | Wirnitzer et al. |

FOREIGN PATENT DOCUMENTS

| | | | |
|---|---|---|---|
| DE | 1957381 | A1 | 5/1971 |
| DE | 102007057904 | A1 | 6/2009 |
| DE | 102008006707 | A1 | 8/2009 |
| DE | 102009000427 | A1 | 7/2010 |
| DE | 102009026806 | A1 | 12/2010 |
| DE | 102009027343 | A1 | 1/2011 |
| DE | 102011081016 | A1 | 2/2013 |
| DE | 102012224424 | A1 | 7/2014 |
| DE | 102014103275 | A1 | 9/2014 |
| DE | 102014000243 | A1 | 11/2014 |
| DE | 102013224645 | A1 | 6/2015 |
| DE | 102014219030 | A1 | 3/2016 |
| DE | 102014222899 | A1 | 5/2016 |
| DE | 102014223353 | A1 | 5/2016 |
| DE | 102016201204 | A1 | 7/2016 |
| EP | 1672972 | | 6/2006 |
| FR | 2719967 | A1 | 11/1995 |
| FR | 2802706 | A1 | 6/2001 |
| FR | 2864342 | A1 | 6/2005 |
| WO | 2009017693 | A1 | 2/2009 |

OTHER PUBLICATIONS

International Search Report and Written Opinion for International Application No. PCT/EP2017/063543, dated Jan. 11, 2018—20 pages.

Johnson et al., "3-D Packaging: A Technology Review", Jun. 23, 2005, http://nepp.nasa.gov/docuploads/EA7E7EA1-BD30-4DA4-BD615FEA1A7F5AE9/3D%20Packaging%20Report%2020071805.pdf—70 pages.

Osenbach et al., "Development of Exposed Die Large Body to Die Size Ratio Wafer Level Package Technology", In: Electronic Components and Technology Conference (ECTC), 2014, IEEE 64th., http://ieeexplore.ieee.org/ielx7/6884273/6897249/06897403.pdf?tp=&arnumber=6897403&isnumber=6897249—S. 952-955.

Val, C., 3D PLUS Stacking Technology, Apr. 28, 2004, ESTEC, Noordwijk Technical Presentations Day on Microelectronic Packaging Technologies, https://escies.org/download/webDocumentFile?id=1888—48 pages.

Val, C., Overview on Interconnection for Medical Technology, Euripedes Forum of Jun. 14, 2012, http://euripides.esystems.at/data/ppt-speaker/session2_Christian-Val.pdf—21 pages.

Chinese Office Action for Chinese Application No. 201780032413.X, dated Jul. 7, 2020, with translation, 17 pages.

Leitgeb, M., "Advanced PCB Technologies, Miniaturisierung, Hochfrequenzamvendungen, Thermal Management", Mar. 24, 2014, 115 pages.

Doug, C.H. Yu, "New System-in-Package (SIP) Integration Technologies," In Custom Integrated Circuits Conference (CICC), 2014, IEEE Proceedings of the IEEE, 6 pages.

* cited by examiner

SENSOR HAVING SYSTEM-IN-PACKAGE MODULE, METHOD FOR PRODUCING THE SAME, AND SENSOR ARRANGEMENT

CROSS REFERENCE TO RELATED APPLICATIONS

This application is the U.S. National Phase Application of PCT International Application No. PCT/EP2017/063543, filed Jun. 2, 2017, which claims priority to German Patent Application No. 10 2016 209 840.3, filed Jun. 3, 2016, the contents of such applications being incorporated by reference herein.

FIELD OF THE INVENTION

The invention relates to a sensor. The sensor has a system-in-package module, which has a number of electrical components, an encapsulation and a number of electrical connection lines for the electrical components. The invention further relates to a method for producing a system-in-package module and to a sensor arrangement.

BACKGROUND OF THE INVENTION

Sensors are produced in a wide variety of ways and are typically used to measure diverse measurement variables, such as a speed, an acceleration or a temperature, for example. In this case, system-in-package modules are often used. A system-in-package is understood here to mean, in particular, a system or a subsystem composed of the combination of semi-conductor chips of different functionalities and the simultaneous integration of passive component parts, applied to a substrate such as a leadframe, a PCB or without a substrate at wafer level and subsequently encapsulated. The system-in-package at wafer level, also known as wafer-level system-in-package (WLSiP), is typically contact-connected to a superordinate system by means of connecting techniques such as LGA or BGA.

Owing to the advancing integration and miniaturization in design and connecting techniques, the present contact-connection forms of plug contacts by means of classic connectors and mating connectors are no longer expedient geometrically and economically. Furthermore, new approaches to a solution for contact-connection are required for wafer-level system-in-package modules.

SUMMARY OF THE INVENTION

Therefore an aspect of the invention provides a sensor that is embodied in an alternative manner, for example in a more miniaturized or more cost-optimized manner, compared to embodiments according to the prior art. A further aspect of the invention is a method for producing a system-in-package module for a sensor and a sensor arrangement having a sensor.

The content of the claims is incorporated in the content of the description by express reference.

An aspect of the invention relates to a sensor. The sensor has a system-in-package module. The system-in-package module has a number of electrical components, an encapsulation and a number of electrical connection lines for the electrical components. Said system-in-package module can be, in particular, a wafer-level system-in-package module.

The electrical components can be, for example, passive or active components, which can be used to implement a sensor functionality. The encapsulation can partially or completely surround, in particular, some of the electrical components or all of the electrical components and hence protect against mechanical or chemical influences. The electrical connection lines serve, in particular, to contact-connect or connect the electrical components to other electrical units.

There is provision according to an aspect of the invention for the system-in-package module to have a number of electrical contacts, wherein each connection line is connected to an electrical contact and wherein the electrical contacts can be contact-connected by way of a mating connector.

Owing to the embodiment according to an aspect of the invention, an indirect contact-connection to a mating connector can be effected. It is advantageously possible to dispense with the design and connecting techniques required according to the prior art. It is thus possible to achieve a more compact design. Furthermore, the costs can be reduced since it is possible to dispense with corresponding steps for producing the contact-connection.

The electrical contacts of the system-in-package module can be embodied, in particular, as contact areas. This allows simple and reliable contact-connection.

The electrical contacts of the system-in-package module can be embodied, in particular, as contact pins. This allows simple and reliable contact-connection.

The electrical contacts or the contact areas or contact pins of the system-in-package module can be embodied, in particular, as part of at least one wiring plane. This allows, in particular, simple production and reliable connection.

The electrical contacts or the contact areas or contact pins of the system-in-package module can be embodied, in particular, as stamped parts. This allows simple production and also simple further processing, in particular in the context of the method described further below.

The stamped parts can be formed, in particular, from copper or from a copper alloy. However, other materials, such as aluminum or silver, for example, can also be used in principle.

The stamped parts of the system-in-package module can have a respective anchoring geometry. Said anchoring geometry can have, in particular, a respective number of recesses, tapered portions and/or bores. This serves, in particular, for anchoring in the encapsulation or in a housing so that a form-fitting and thus reliable connection can be produced easily in the case of a corresponding production.

The stamped parts of the system-in-package module are preferably connected to the electrical components by means of a number of wiring planes. This allows simple production and reliable electrical connection.

The encapsulation of the system-in-package module preferably at least partially or else completely surrounds the electrical components. The encapsulation also preferably partially surrounds the electrical contacts. Owing to the encapsulation, in particular, advantageous protection against mechanical or chemical influences can be achieved. Owing to an only partial surrounding of the electrical contacts, an advantageous ability to contact-connect the electrical contacts can be achieved.

According to a preferred embodiment, the sensor has a housing, in which a connector region is configured to receive the mating connector. In particular, the mating connector can be configured in connection with the encapsulation. A simple receptacle for a mating connector can be configured by means of such a connector region. In this case, the mating connector can be, in particular, a consumer connector, that is to say which serves, for example, in an end product such as an automobile, for example, for contact-connection of the sensor, that is to say, for example, for connection to a vehicle electronics system.

The fact that the housing forms the connector region in connection with the encapsulation can be understood to mean, in particular, that the encapsulation projects at least partly into the connector region and is also at least partly contact-connected by the mating connector.

In particular, the electrical contacts in the connector region can be configured so that they can be contact-connected there by a mating connector.

The electrical contacts of the system-in-package module can be able to be contact-connected by the mating connector, in particular, by means of a force-fitting connection and/or a plug connection.

The electrical contacts of the system-in-package module can be able to be contact-connected by the mating connector, for example, by means of a latching or else by means of a non-latching connection.

The electrical contacts of the system-in-package module can be able to be contact-connected by the mating connector, for example, by means of a sealed or else by means of a non-sealed connection.

A number of spring contacts can be formed in the mating connector, for example, wherein each spring contact contact-connects an electrical contact of the system-in-package module.

An aspect of the invention further relates to a method for producing a system-in-package module, in particular a system-in-package module for a sensor, which method has the following steps:
 providing a film or a substrate, wherein the substrate has a printed electrical circuit,
 applying a number of electrical components to the film or the substrate,
 applying a number of electrical contacts to the film or the substrate,
 applying an encapsulation to the film or the substrate, in particular at wafer level, which encapsulation covers the electrical components and partially covers the electrical contacts.

The term wafer level is preferably understood to mean that the encapsulation of a plurality of mutually adjoining units of film or substrate, electrical components and contacts is carried out in one plane and in one method step.

The encapsulation can be applied, for example, by way of transfer molding, in particular a transfer molding method or compression molding.

The method preferably further comprises the step of:
 applying a metalization to the encapsulation, particularly preferably by means of a lithographic method, so that the metalization connects the electrical components to the electrical contacts.

The method preferably further comprises the steps of:
 providing a wafer,
 separating the encapsulation of the system-in-package module from the wafer.

In the context of aspects of the invention, a substrate is preferably understood to mean a carrier, particularly preferably made of an organic material, onto which electronics systems can be printed. A substrate that has a printed electrical circuit is preferably understood to mean that electronic functional materials, which are present in the case of the production in liquid or paste form, are printed on the substrate to form an electrical circuit or to form parts of such a circuit.

The substrate is preferably formed as a polymer film, in particular as a polymer film containing polyethylene terephthalate and/or polyethylene naphthalate.

By means of the method according to an aspect of the invention, production of a system-in-package module that can be used, in particular, for a sensor according to an aspect of the invention can advantageously be achieved. The use of the film allows particularly simple and reliable execution of the method. The encapsulation can also achieve, for example, the advantages mentioned further above in the end product so that said encapsulation typically also remains in the finished system-in-package module or in the finished sensor. In particular, an electrical connection between the electrical components and the electrical contacts is produced by means of the metalization.

The system-in-package module is configured, in particular, for a sensor according to an aspect of the invention. In this case, it is possible, in principle, to refer back to all the embodiments and variants described. In particular, the system-in-package module can be configured for a sensor, in which the contact areas or contact pins are embodied as stamped parts. Stamped parts of this kind can be processed particularly advantageously in the context of the method according to an aspect of the invention.

The electrical contacts can be configured, in particular, as contact areas, contact pins and/or as stamped parts. Reference is made, for example, to the above description in respect of specific embodiments.

The stamped parts can have, in particular, a respective anchoring geometry, in particular comprising recesses, tapered portions and/or bores. This allows simple configuration of a respective form-fitting connection during execution of the method. Furthermore, a reliable hold of the respective stamped parts is achieved even in the finished product.

A sensor, which, for example, can be configured as described herein or which can be produced by means of a method described herein, can be, in particular, a sensor, which detects the physical variable of at least one of the following variables: speed, acceleration, rate of rotation, pressure, temperature, direction and strength of a magnetic field. In the case of such sensors, the embodiment described herein or the method according to an aspect of the invention has proven to be particularly advantageous. However, other sensors are also conceivable in principle.

An aspect of the invention further relates to a sensor arrangement. The sensor arrangement has a sensor, which is embodied as described herein and/or which has been produced by means of a method according to an aspect of the invention. In respect of the sensor and the method, respectively, reference can be made to all of the embodiments and variants described herein.

The sensor arrangement further has a mating connector, which is received in a connector region of the sensor, in particular in a connector region of a housing of the sensor.

In the case of the sensor arrangement according to an aspect of the invention, the sensor is contact-connected by a mating connector, for example a consumer connector, in an advantageous manner. The advantages described further above can thus be achieved.

In particular, a number of spring contacts can be formed in the mating connector, wherein each spring contact contact-connects an electrical contact of the system-in-package module. Simple and reliable electrical contact-connection can be achieved by means of such spring contacts.

In general, it should be mentioned that, for example, a wafer-level system-in-package module (WLSiP) is applied to a superordinate substrate or wiring carrier not by means of BGA or LGA contact-connection but directly using a mating contact of a consumer interface. Further substrates or wiring carriers and connecting techniques can therefore be omitted. The advantage that contact pins or contact elements required by (satellite) sensors in the prior art, for example stamped parts, which constitute the internal contact-connection for the consumer interface, can be omitted also comes into effect.

In a particularly simple case, contact areas are generated simultaneously during the process of the production of the wiring planes of the wafer-level system-in-package. The mating connector can then be brought onto said contact areas.

A further advantage of an aspect of the invention described herein can consist, for example, in contact elements suitable for a robust embodiment of a contact-connection of a wafer-level system-in-package being able to be integrated in the process of the production of a wafer-level system-in-package. This can mean, for example, that copper stamped parts are applied together with the electronic component parts during the population of the temporary carrier film. Subsequently, the copper stamped parts and the electronic component parts are encapsulated at wafer level and the carrier film can be removed. The copper stamped parts can have, in particular, a suitable geometry for anchoring in the encapsulation. This can be, for example, recesses, tapered portions, bores or similar.

Such an encapsulated arrangement now typically has exposed contact points of the electronic component parts and the copper stamped parts. These can be subsequently provided with a plurality of wiring planes and simultaneously electrically contact-connected as a result. Finally, singularization takes place at wafer level and a multiplicity of small wafer-level system-in-package modules are consequently produced.

The wafer-level system-in-package described herein with or without robust contact-connection can further be surrounded, in particular, by a housing.

BRIEF DESCRIPTION OF THE DRAWINGS

Further features and advantages will be gathered by a person skilled in the art from the exemplary embodiment described below with reference to the appended drawing, in each case, schematically.

DETAILED DESCRIPTION OF THE PREFERRED EMBODIMENTS

It should be understood that a respective figure denoted by "A" shows in each case a plan view whereas a respective figure denoted by "B" shows a respective lateral sectional view.

Figure 1A:
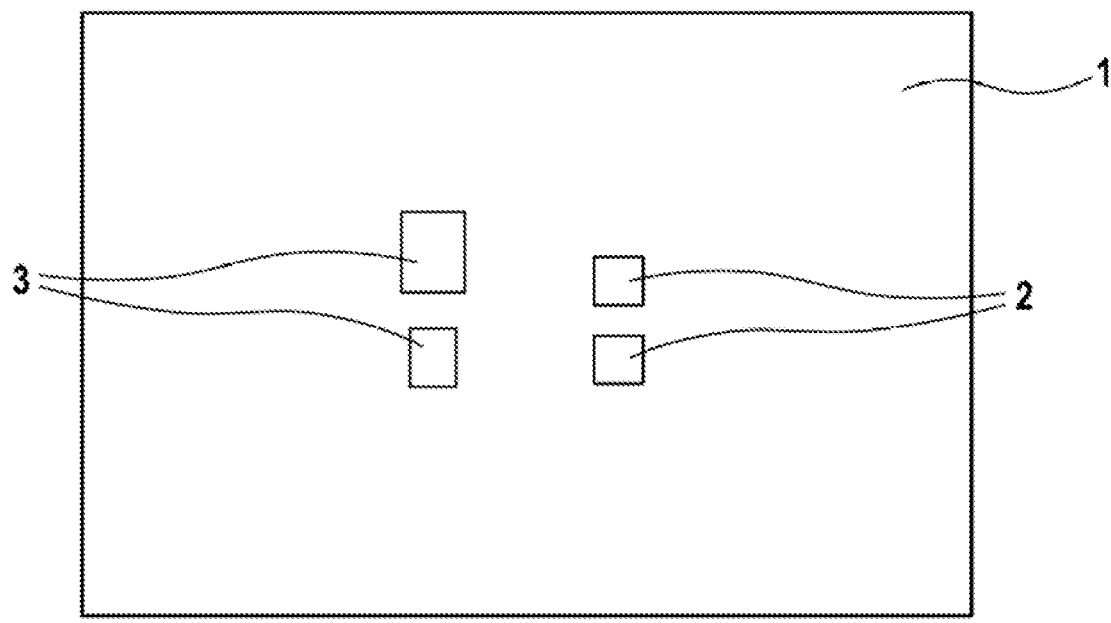
FIGS. 1A and 1B: a state at the beginning of a production method.
Figure 1B:

FIGS. 1A and 1B show a state that occurs at the beginning of a method according to an aspect of the invention. These and the other figures show, in particular, states that can occur, for example, during execution of a method according to an aspect of the invention for producing a system-in-package module according to an aspect of the invention.

In FIGS. 1A, 1B, a film 1, to which a number of electrical contacts 2 and a number of electrical components 3 have been applied, is present. The electrical contacts 2 are in this case embodied, in particular, as copper stamped parts having a corresponding anchoring geometry, which is not shown. The electrical components 3 are typical active or passive component parts of a sensor.

Figure 2A:
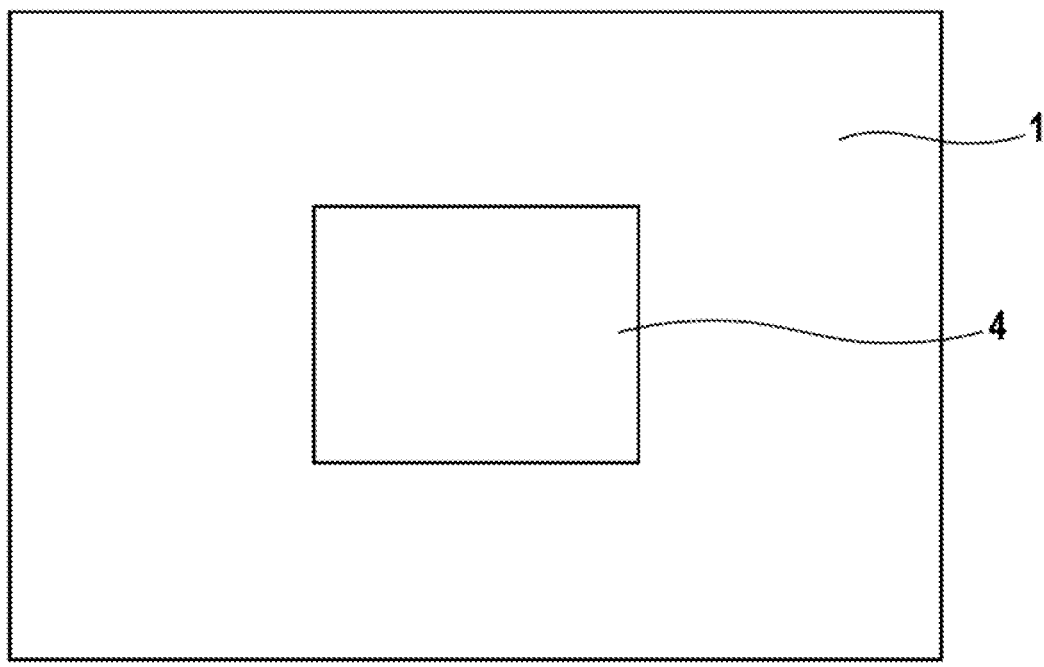
FIGS. 2A and 2B: a state after application of an encapsulation.
Figure 2B:
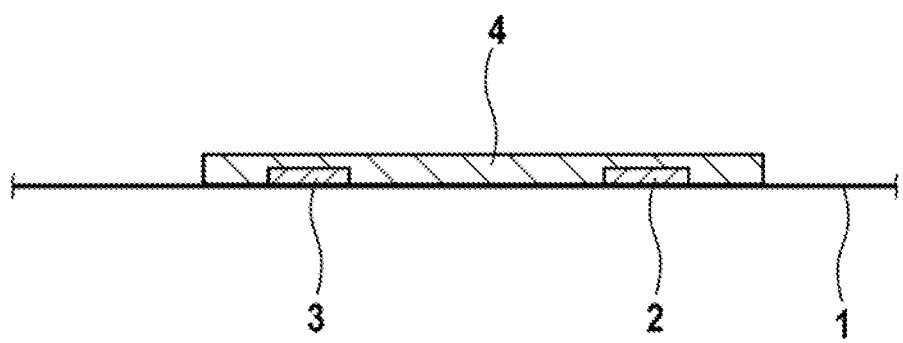

FIGS. 2A, 2B show a state according to which an encapsulation 4 has been applied to the film 1 so that said encapsulation covers the electrical components 3 and the electrical contacts 2. The film 1 can subsequently be removed so that, in particular, the electrical contacts 2 are exposed in a further possible state. Said electrical contacts can thus be electrically contact-connected. The electrical components 3 can in this case either be likewise exposed or they can be encapsulated in a suitable manner or covered in some other way.

Figure 3A:
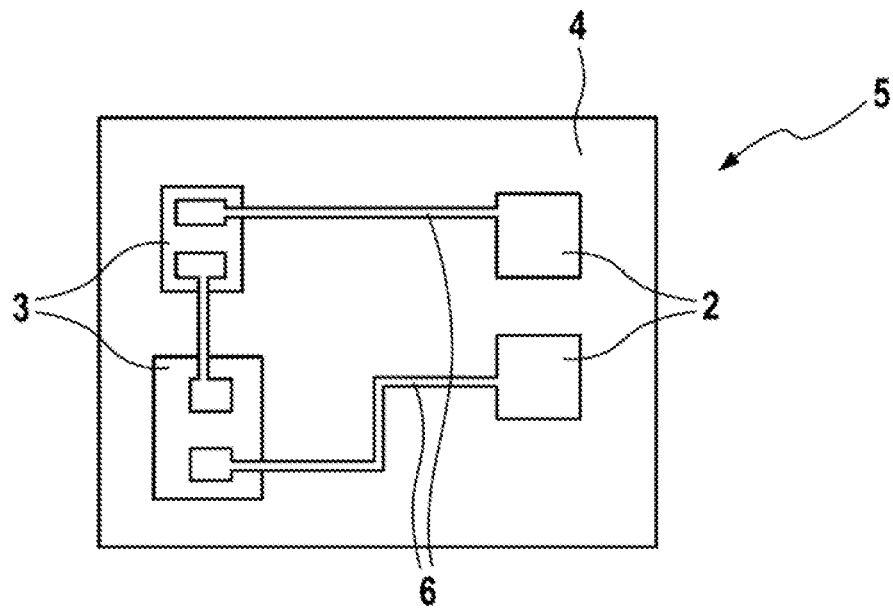
FIGS. 3A and 3B: a state after application of a metalization.
Figure 3B:
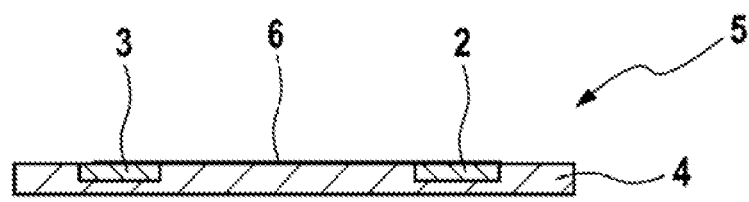

FIGS. 3A, 3B show a state after the application of a metalization 6, which forms a wiring plane. A connection between the electrical contacts 2 and the electrical components 3 is thus produced. By way of contact-connecting the electrical contacts 2, an electrical connection to the electrical components 3 can consequently ultimately be produced by means of the metalization 6.

The application of the metalization 6 produces, in particular, a wafer-level system-in-package module 5.

Figure 4A:
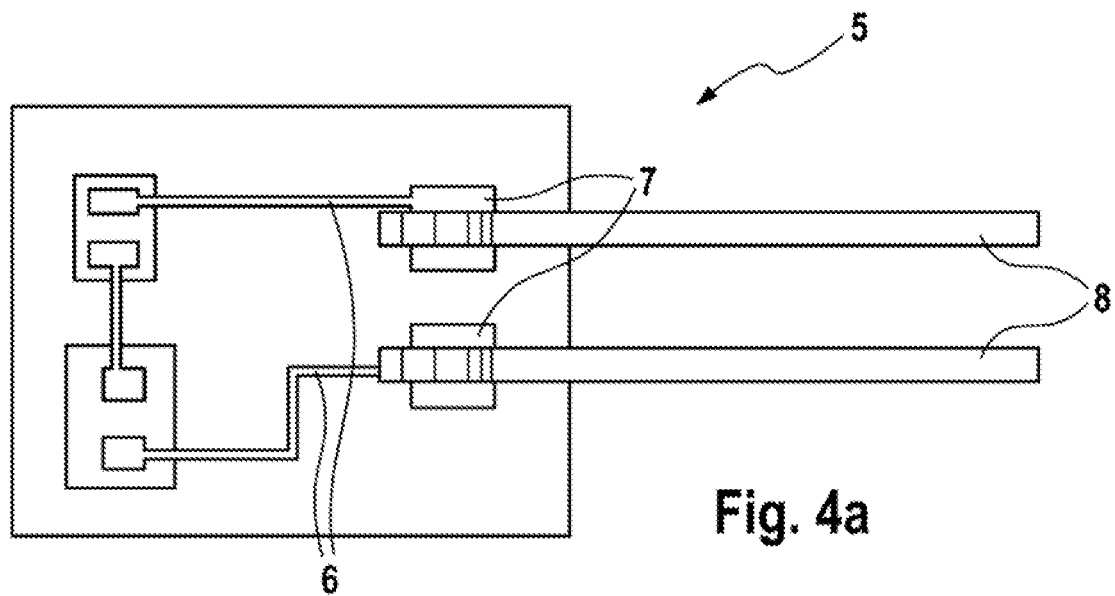
FIGS. 4A and 4B: a state with contact-connection by way of a mating connector.
Figure 4B:
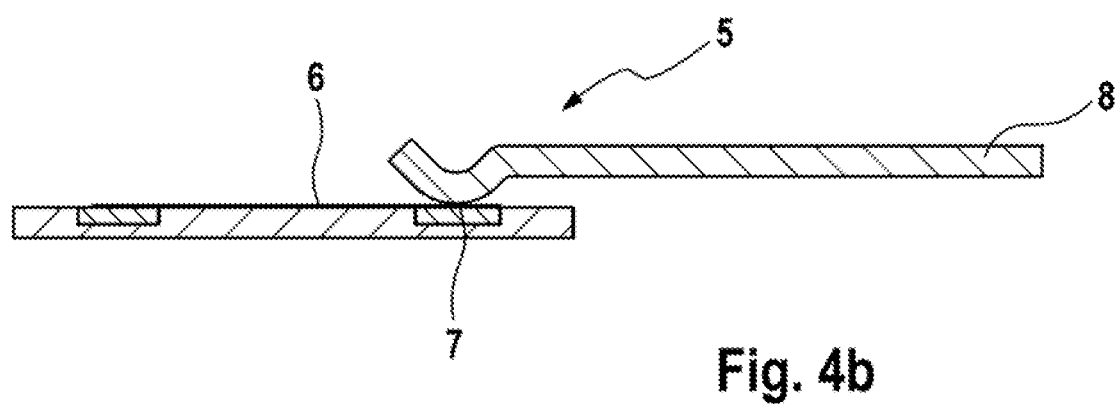

FIGS. 4A, 4B show the wafer-level system-in-package module 5 in a state, in which it is contact-connected by electrical spring contacts 8 of a mating connector. Said electrical spring contacts 8 in this case enter into electrical connection or contact, in particular, with contact areas 7, which are formed by the electrical contacts 2 already described further above.

As can be seen, in particular, in FIG. 4B, a force-fitting connection to the contact areas 7 is produced by way of a suitable geometry of the respective electrical spring contact 8. In this case, the electrical spring contacts 8 are, in particular, part of a mating connector, in particular a consumer connector.

Figure 5:
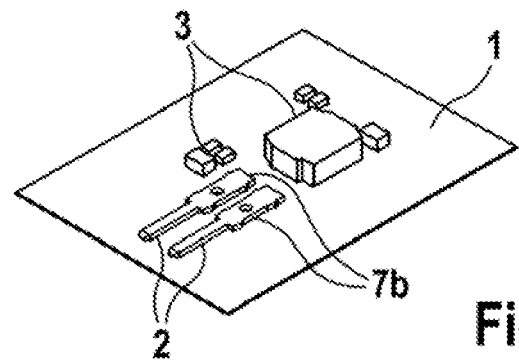
FIG. 5: a further exemplary embodiment of an aspect of the invention in a spatial illustration at the beginning of a production method.
Figure 6:
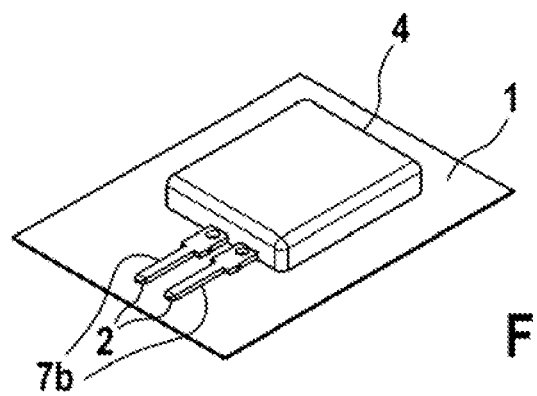
FIG. 6: the exemplary embodiment of an aspect of the invention according to FIG. 5 after application of an encapsulation.
Figure 7:
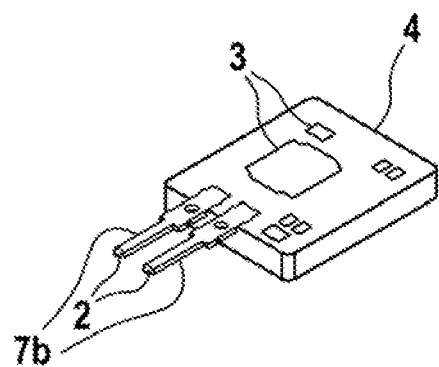
FIG. 7: the exemplary embodiment of an aspect of the invention according to FIG. 5 from another view after application of an encapsulation.
Figure 8:
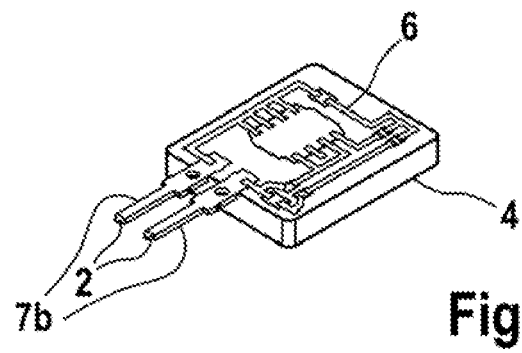
FIG. 8: the exemplary embodiment of an aspect of the invention according to FIG. 5 after application of a metalization.
Figure 9:
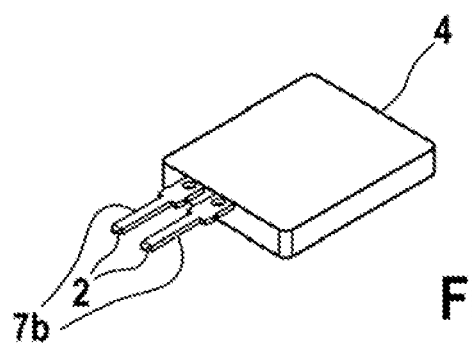
FIG. 9: the exemplary embodiment of an aspect of the invention according to FIG. 5 after application of a protective or passivation layer.

FIG. 5 shows a state that occurs at the beginning of a method according to an aspect of the invention. Unlike in the preceding figures, in this exemplary embodiment, the contacts 2 are configured as contact pins 7b. The states illustrated in the following FIGS. 5 to 10 are to be understood as analogous to FIGS. 1 to 3 and are therefore not explained once again. The metalization 6 shown in FIG. 8 produces, in particular, a wafer-level system-in-package module 5. Since the contacts 2 are embodied as contact pins 7b, they project out of the encapsulation, as shown in FIG. 9, and are consequently able to be contact-connected by a mating connector in a simple manner.

Figure 10:
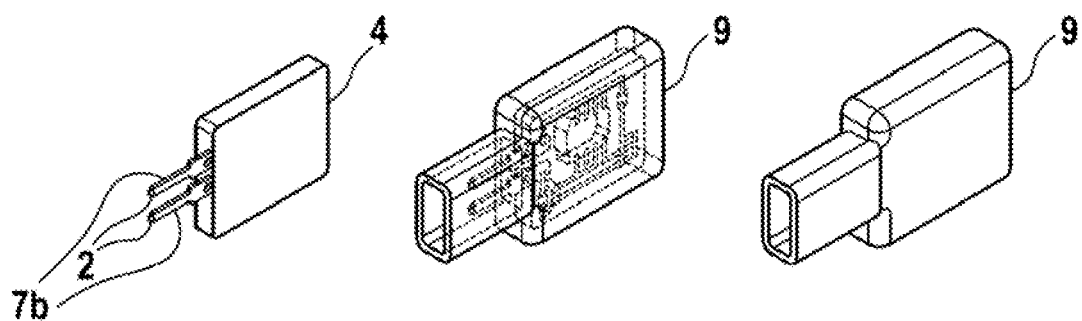
FIG. 10: the exemplary embodiment of an aspect of the invention according to FIG. 5 after overmolding of a housing in a respective separate view having a translucent, transparent and non-transparent illustration of the housing.

FIG. 10 shows a housing 9 in a transparent and a non-transparent illustration, which housing can be produced by overmolding, for example with a thermoplastic. The housing 9 has a connector collar for receiving a mating connector. Further construction elements, such as a fastening flange, can be integrated into the housing 9, but are not illustrated here.

Figure 11:
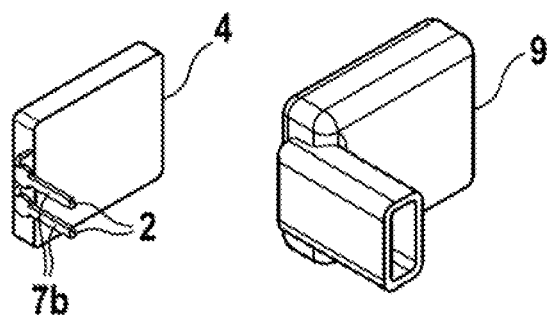
FIG. 11: a further exemplary embodiment of an aspect of the invention having angled electrical contacts having a separately illustrated housing.

One exemplary embodiment of an aspect of the invention having angled contact pins 7b is illustrated in FIG. 11. In the housing 9, the connector collar is accordingly configured at a right angle to the rest of the housing 9.

Figure 12:
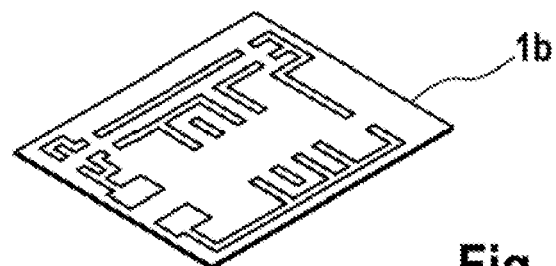
FIG. 12: a further exemplary embodiment of an aspect of the invention having a substrate having a printed electrical circuit in a spatial illustration at the beginning of a production method.
Figure 13:
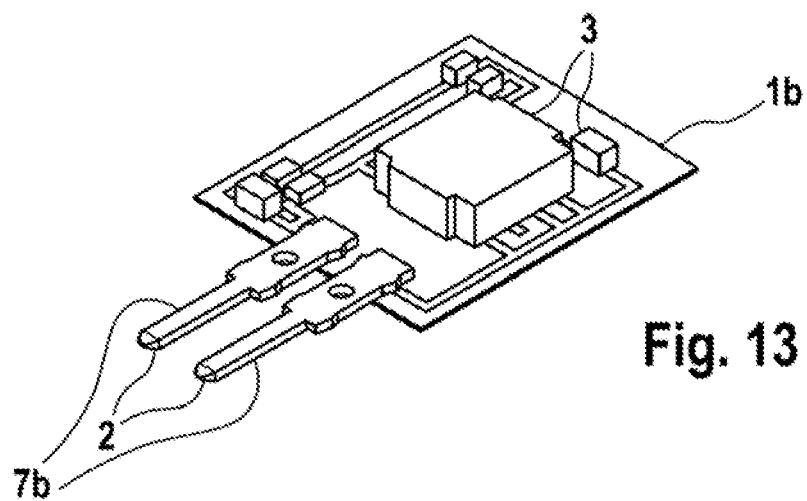
FIG. 13: the exemplary embodiment of an aspect of the invention according to FIG. 12 after application of electrical components and contacts.
Figure 14:
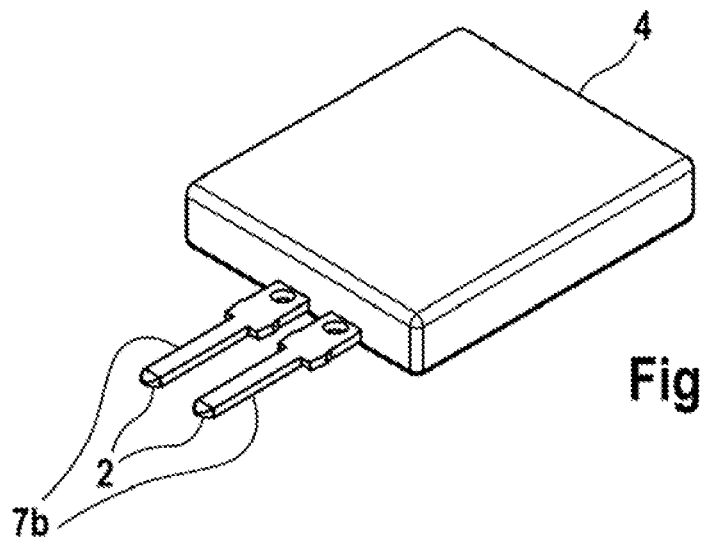
FIG. 14: the exemplary embodiment of an aspect of the invention according to FIG. 12 after application of an encapsulation.

Instead of a film 1, it is possible to use a substrate 1b having a printed electrical circuit as carrier of a number of electrical contacts 2 and a number of electrical components 3, as illustrated in FIGS. 12 and 13. The substrate 1b already contains the wiring plane that is used to produce a connection between the electrical contacts 2 embodied as contact pins 7b and the electrical components 3. A state after encapsulation is illustrated in FIG. 14.

Figure 15:
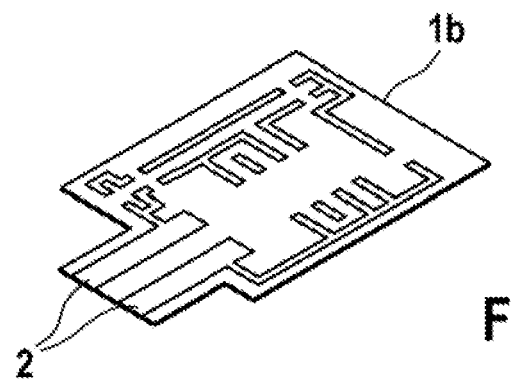
FIG. 15: a further exemplary embodiment of an aspect of the invention having a substrate having a printed electrical circuit in a spatial illustration at the beginning of a production method.
Figure 16:
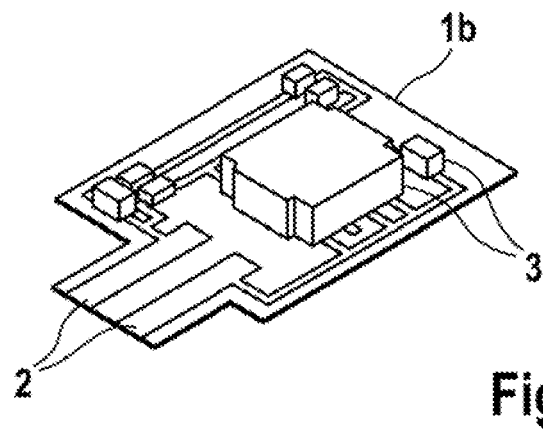
FIG. 16: the exemplary embodiment of an aspect of the invention according to FIG. 15 after application of electrical components and contacts.
Figure 17:
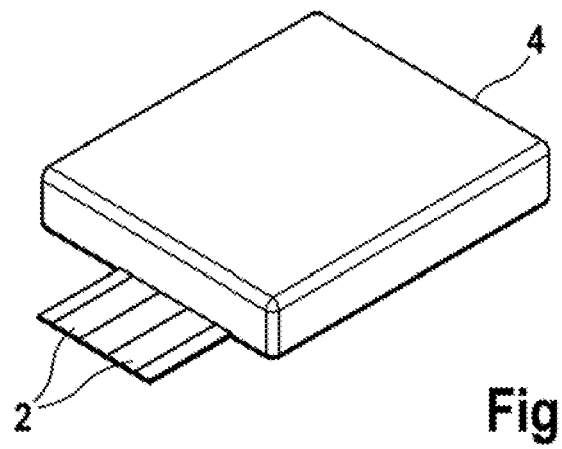
FIG. 17: the exemplary embodiment of an aspect of the invention according to FIG. 15 after application of an encapsulation.

Instead of contact pins 7b, contact areas 7, which are integrated into the substrate 1b, are provided according to the exemplary embodiment of FIG. 15. As can be seen in FIG. 16, consequently only electrical components 3 are applied to the substrate 1b in a further step of the production. A state after application of an encapsulation is illustrated in FIG. 17.

Figure 18:
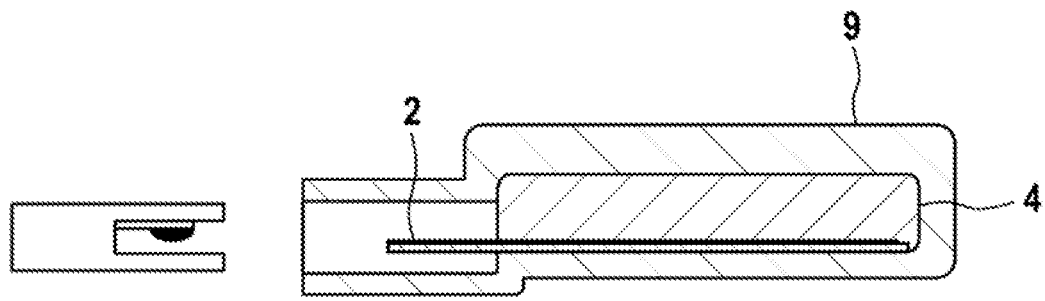
FIG. 18: the exemplary embodiment of an aspect of the invention according to FIG. 15 in a sectional view together with a mating connector.
Figure 19:
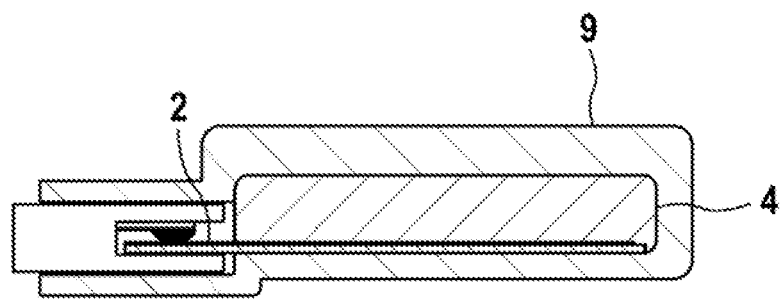
FIG. 19: the exemplary embodiment of an aspect of the invention according to FIG. 15 in a sectional view having a contact-connected mating connector.

The contact-connection of the contact areas 7 is possible using a mating connector in the form of an edge or direct connector, as illustrated in the sectional view of FIG. 18. FIG. 19 shows a state in which the contacts 2 are electrically contact-connected to the mating connector or the contacts thereof.

Mentioned steps of the method according to an aspect of the invention can be executed in the indicated order. However, they can also be executed in a different order. In one of its embodiments, for example with a specific combination of steps, the method according to an aspect of the invention can be executed in such a way that no further steps are executed. However, in principle, further steps can also be executed, even steps of a kind which have not been mentioned.

The claims that are part of the application do not represent any dispensing with the attainment of further protection.

If it turns out in the course of the proceedings that a feature or a group of features is not absolutely necessary, then the applicant aspires right now to a wording for at least one independent claim that no longer has the feature or the group of features. This may be, by way of example, a subcombination of a claim present on the filing date or may be a subcombination of a claim present on the filing date that is limited by further features. Claims or combinations of features of this kind requiring rewording can be understood to be covered by the disclosure of this application as well.

It should further be pointed out that configurations, features and variants of aspects of the invention that are described in the various embodiments or exemplary embodiments and/or shown in the figures can be combined with one another in any way. Single or multiple features can be interchanged with one another in any way. Combinations of features arising therefrom can be understood to be covered by the disclosure of this application as well.

Back-references in dependent claims are not intended to be understood as dispensing with the attainment of independent substantive protection for the features of the back-referenced subclaims. These features can also be combined with other features in any way.

Features that are disclosed only in the description or features that are disclosed in the description or in a claim only in conjunction with other features may fundamentally be of independent significance essential to aspects of the invention. They can therefore also be individually included in claims for the purpose of distinction from the prior art.

The invention claimed is:

1. A sensor, comprising:
   a wafer-level system-in-package module comprising a number of electrical components supported on a film or a substrate, an encapsulation at least partially surrounding the number of electrical components supported on the film or the substrate, and a number of electrical connection lines for the electrical components,
   wherein
   the wafer-level system-in-package module has a number of electrical contacts,
   wherein each connection line is connected to an electrical contact, and
   wherein the electrical contacts can be contact-connected by way of a mating connector.

2. The sensor as claimed in claim 1,
   wherein
   the electrical contacts of the wafer-level system-in-package module are configured as contact areas or as contact pins.

3. The sensor as claimed in claim 1 wherein,
   the electrical contacts of the wafer-level system-in-package module are embodied as part of at least one wiring plane.

4. The sensor as claimed in claim 1 wherein,
   the electrical contacts of the wafer-level system-in-package module are embodied as stamped parts.

5. The sensor as claimed in claim 4,
wherein
the stamped parts of the wafer-level system-in-package module have a respective anchoring geometry, comprising at least one of recesses, tapered portions, or bores.

6. The sensor as claimed in claim 5, wherein the stamped parts of the wafer-level system-in-package module are connected to the electrical components by a number of wiring planes.

7. The sensor as claimed in claim 4,
wherein
the stamped parts of the wafer-level system-in-package module are connected to the electrical components by a number of wiring planes.

8. The sensor as claimed in claim 1,
wherein
the encapsulation of the wafer-level system-in-package module at least partially surrounds the electrical components and partially surrounds the electrical contacts.

9. The sensor as claimed in claim 1,
wherein
the sensor has a housing, in which a connector region is configured to receive the mating connector, in connection with the encapsulation.

10. The sensor as claimed in claim 1,
wherein
the sensor is configured to detect a physical variable of at least one of the following variables: speed, acceleration, rate of rotation, pressure, temperature, direction and strength of a magnetic field.

11. The sensor as claimed in claim 1, wherein the wafer-level system-in-package module further comprises a housing at least partially surrounding the encapsulation, and wherein the housing partially surrounds the number of electrical contacts to define a receptacle configured to receive the mating connector.

12. A method for producing a wafer-level system-in-package module, comprising:
    providing a film or a substrate, wherein the substrate has a printed electrical circuit,
    applying a number of electrical components to the film or the substrate,
    applying a number of electrical contacts to the film or the substrate, and
    applying an encapsulation to the film or the substrate, at the wafer level, which encapsulation covers the electrical components applied to the film or the substrate and partially covers the electrical contacts applied to the film or the substrate to produce the wafer-level system-in-package module.

13. The method as claimed in claim 12,
wherein the method further comprises:
    applying a metalization to the encapsulation so that the metalization connects the electrical components to the electrical contacts.

14. The method as claimed in claim 12,
wherein the electrical contacts are configured as contact areas, contact pins and/or as stamped parts.

15. The method as claimed in claim 14,
wherein the stamped parts have a respective anchoring geometry, comprising at least one of recesses, tapered portions, or bores.

16. The sensor as claimed in claim 12, wherein the sensor is configured to detect a physical variable of at least one of the following variables: a speed, an acceleration, a rate of rotation, a pressure, a temperature, a direction and a strength of a magnetic field.

17. The method as claimed in claim 12, wherein the step of providing the film or the substrate comprises providing the film, and further comprising a step of removing the film from the encapsulated electrical components and electrical contacts.

18. A sensor arrangement, comprising:
    a sensor including a wafer-level system-in-package module comprising a number of electrical components supported on a film or a substrate, an encapsulation at least partially surrounding the number of electrical components supported on the film or the substrate, and a number of electrical connection lines for the electrical components,
    wherein the wafer-level system-in-package module has a number of electrical contacts, each connection line is connected to an electrical contact, and the electrical contacts can be contact-connected by way of
    a mating connector, which is received in a connector region of a housing of the sensor.

* * * * *